(12) United States Patent
Xi

(10) Patent No.: US 9,515,226 B2
(45) Date of Patent: Dec. 6, 2016

(54) LIGHT EMITTING DEVICE AND METHOD FOR MAKING THE SAME

(71) Applicant: Yangang Xi, Forest Hills, NY (US)

(72) Inventor: Yangang Xi, Forest Hills, NY (US)

(*) Notice: Subject to any disclaimer, the term of this patent is extended or adjusted under 35 U.S.C. 154(b) by 0 days.

(21) Appl. No.: 14/109,188

(22) Filed: Dec. 17, 2013

(65) Prior Publication Data

US 2015/0014697 A1 Jan. 15, 2015

Related U.S. Application Data

(60) Provisional application No. 61/844,712, filed on Jul. 10, 2013.

(51) Int. Cl.
*H01L 33/32* (2010.01)
*H01L 33/00* (2010.01)

(52) U.S. Cl.
CPC ........... *H01L 33/32* (2013.01); *H01L 33/0075* (2013.01)

(58) Field of Classification Search
CPC .................. H01L 33/0075; H01L 33/32
See application file for complete search history.

(56) References Cited

U.S. PATENT DOCUMENTS

| | | | |
|---|---|---|---|
| 6,929,867 B2 | 8/2005 | Armitage et al. | |
| 7,842,939 B2 | 11/2010 | Jorgenson et al. | |
| 7,915,624 B2 | 3/2011 | Jorgenson | |
| 8,253,157 B2 | 8/2012 | Jorgenson | |
| 2004/0079949 A1* | 4/2004 | Chiyo | H01L 21/0237 257/79 |
| 2005/0167693 A1 | 8/2005 | Goetz et al. | |
| 2006/0145166 A1 | 7/2006 | Akasaki et al. | |
| 2009/0184398 A1* | 7/2009 | Choi | H01L 21/02378 257/615 |
| 2009/0230842 A9 | 9/2009 | Son et al. | |
| 2010/0184273 A1 | 7/2010 | Choi et al. | |
| 2011/0189838 A1 | 8/2011 | Kouvetakis et al. | |
| 2012/0001213 A1 | 1/2012 | Jorgenson | |
| 2013/0032836 A1 | 2/2013 | Chen et al. | |
| 2013/0048939 A1* | 2/2013 | Zhang | H01L 21/0242 257/13 |
| 2014/0203287 A1* | 7/2014 | Zhang | H01L 33/145 257/76 |

OTHER PUBLICATIONS

Seo, H.S., et al. "Growth and physical properties of epitaxial HfN layers on MgO(001)" Journal of Applied Physics, vol. 96, No. 1, Jul. 1, 2004. pp. 878-884.

Jayaraman, S., et al. "HfB2 and Hf—B—N hard coatings by chemical vapor deposition" Surface & Coatings Technology 200 (2006) pp. 6629-6633.

(Continued)

*Primary Examiner* — Latanya N Crawford
(74) *Attorney, Agent, or Firm* — Hamre, Schumann, Mueller & Larson, P.C.

(57) ABSTRACT

A light emitting device comprises a substrate, a semiconductor body, and a transition layer. The semiconductor body is configured to generate light and comprises an n-type layer disposed on the substrate, a p-type layer disposed on the n-type layer, and an active layer disposed between the n-type layer and the p-type layer. The transition layer is disposed on the substrate and located between the n-type layer and the substrate, and comprises a plurality of sub-layers. The plurality of the sub-layers comprise compositions different from each other, and each sub-layer comprise the composition including IIIA metal, transition metal, and nitrogen. The light emitting device further comprises a p-contact layer disposed on the p-type layer of the semiconductor body. A substrate structure and a method for making the light emitting device are also presented.

33 Claims, 9 Drawing Sheets

(56) References Cited

OTHER PUBLICATIONS

Liao, M.Y., et al. "Growth and stress evolution of hafnium nitride films sputtered from a compound target" J. Vac. Sci. Technol. A 22 (1), 2004. pp. 214-220.

Wang, Wenwu, et al. "The Fabrication of Hafnium Nitride by Metal Organic Chemical Vapor Deposition (MOCVD) Using TDEAHf Precursor for Gate-Electrode Application" Japanese Journal of Applied Physics, vol. 43, No. 11A, 2004. pp. L1445-L1448.

Howe, B.M., et al. "Real-time control of AlN incorporation in epitaxial Hf1-xAlxN using high-flux, low-energy (10-40 eV) ion bombardment during reactive magnetron sputter deposition from a Hf0.7Al0.3 alloy target" Acta Materialia 59 (2011) pp. 421-428.

Zhang, Jianping, et al. "Hafnium-doped GaN with n-type electrical resistivity in the 10-4 cm .ohm range" Applied Physics Letters, 99, 202113 (2011) pp. 1-3.

Howe, B., et al. "Growth and physical properties of epitaxial metastable Hf1-xAlxN alloys deposited on MgO(001) by ultrahigh vacuum reactive magnetron sputtering" Surface & Coatings Technology 202 (2007) pp. 809-814.

Wang, W.W., et al. "Effect of NH3 on the fabrication of HfN as gate-electrode using MOCVD" Thin Solid Films 498 (2006) pp. 75-79.

Kim, Younsou, et al. "Metal-Organic CVD of Conductive and Crystalline Hafnium Nitride Films" Chemical Vapor Depositions, 11, 2005, pp. 294-297.

Xu, X., et al. "Epitaxial condition and polarity in GaN grown on a HfN-buffered Si(111) wafer" Applied Physics Letters, 86 (2005) pp. 1-3.

Han, J.G., et al. "Growth of Hf(C,N) thin films on Si(100) and D2 steel substrates by plasma assisted MOCVD" Surface and Coatings Technology 131 (2000) pp. 73-78.

Armitage, R., et al. "Lattice-matched HfN buffer layers for epitaxy of GaN on Si" Applied Physics Letters, vol. 81, No. 8. (2002) pp. 1450-1452.

Howe, Marcus. "Growth, Physical Properties, and Nanostructuring of Epitaxial Metastable Hafnium Aluminum Nitride" Dissertation, University of Illinois at Urbana-Champaign, 2010. 144 pages.

International Search Report and Written Opinion for international application No. PCT/US2014/041064, dated Sep. 24, 2014 (9 pages).

\* cited by examiner

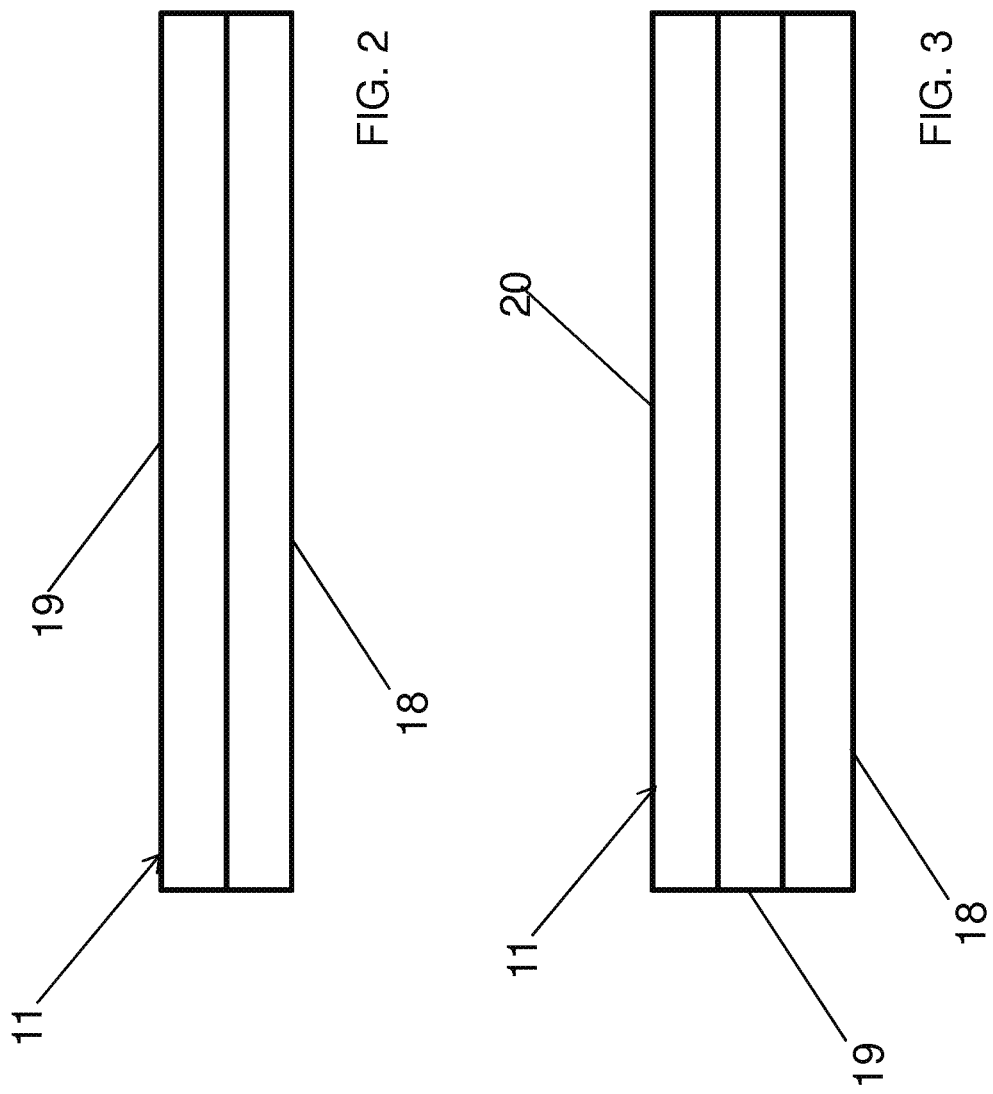

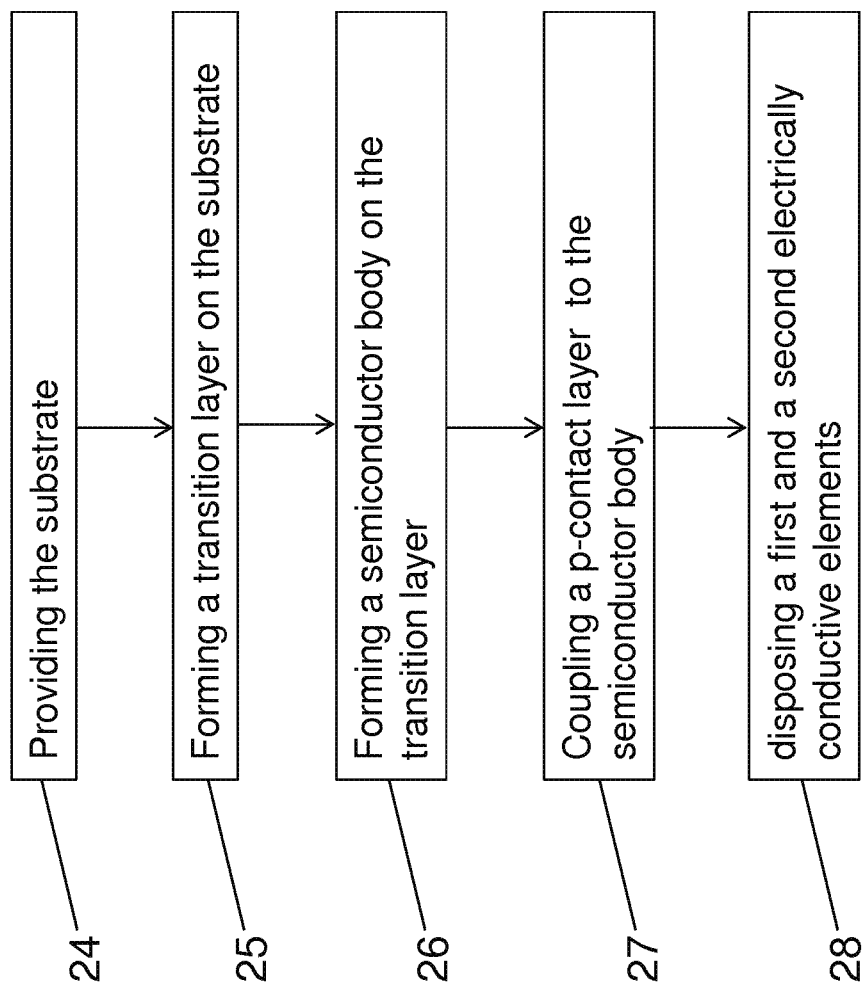

LIGHT EMITTING DEVICE AND METHOD FOR MAKING THE SAME

RELATED APPLICATIONS

This application claims benefit under 35 U.S.C. 119(e) of U.S. Provisional Patent Application No. 61/844,712, filed Jul. 10, 2013, "IIIA-transition metal nitrides for light emitting diodes and a LED made therefrom," to Yangang Xi, the contents of which are hereby incorporated herein by reference in its entirety.

BACKGROUND OF THE DISCLOSURE

This invention relates generally to light emitting devices and methods for making the same. More particularly, this invention relates to light emitting diodes and methods for making the same.

Light emitting devices, such as light emitting diodes (LEDs), are semiconductor devices that generate light from electrical excitation where electrons and holes combine to annihilate, and thereby forming photons. Typically, III-Nitride based light emitting diodes, such as gallium nitride (GaN) based light emitting diodes have been widely used in many applications due to the ability thereof to output light having wavelengths in the ultra-violet (UV), blue and green regimes.

During formation of the gallium nitride based light emitting diodes, gallium nitride is generally directly deposited on substrates, such as sapphire and silicon by metal organic chemical vapor deposition (MOCVD) or molecular-beam epitaxy (MBE). However, the gallium nitride layer on the substrates may crack upon cooling to room temperature, and gallium may have poor wetting on silicon substrate surfaces to cause failure of the formation of the gallium nitride based light emitting diodes.

There have been attempts to solve the issues during deposition of gallium nitride. In one example, transition metal nitride, such as hafnium nitride (HfN) or zirconium nitride (ZrN) are disposed on the substrates to function as a buffer layer prior to the deposition of gallium nitride on the substrate. In another example, hafnium nitride (HfN) or zirconium nitride (ZrN) is embedded into the gallium nitride based light emitting diodes to function as a current spreading layer and a metallic reflector. However, during formation, an interface between gallium nitride and transition metal nitride may not be controlled readily. In addition, transition metal nitride may react with hydrogen ($H_2$) during MOCVD growth, and direct growth of transition metal nitride on the substrates may also be challenging, which cause difficulties and increasing of the cost of the formation of the light emitting diodes.

Therefore, there is a need for new and improved light emitting devices and methods for making the same to make the light emitting devices to have high performance and to reduce difficulties of the formation thereof.

BRIEF DESCRIPTION

A light emitting device is provided, in accordance with one aspect of the invention. The light emitting device comprises a substrate, a semiconductor body, and a transition layer. The semiconductor body is configured to generate light and comprises an n-type layer disposed on the substrate, a p-type layer disposed on the n-type layer and an active layer disposed between the n-type layer and the p-type layer. The transition layer is disposed on the substrate and located between the n-type layer and the substrate, and comprises a plurality of sub-layers. The plurality of the sub-layers comprises compositions different from each other, and each sub-layer comprises the composition including IIIA metal, transition metal, and nitrogen. The light emitting device further comprises a p-contact layer disposed on the p-type layer of the semiconductor body.

A substrate structure is provided, in accordance with another aspect of the invention. The substrate structure comprises a substrate and a transition layer. The transition layer is disposed on the substrate and located between the n-type layer and the substrate. The transition layer comprises a plurality of sub-layers. The plurality of the sub-layers comprises compositions different from each other, and each sub-layer comprises the composition including IIIA metal, transition metal, and nitrogen.

A method for making a light emitting device is also provided, in accordance with yet another aspect of the invention. The method comprises providing a substrate; forming a transition layer on the substrate, wherein the transition layer comprises a plurality of sub-layers, the plurality of the sub-layers comprises compositions different from each other, and each sub-layer comprises the composition including IIIA metal, transition metal, and nitrogen; forming an n-type layer on the transition layer; forming an active layer on the n-type layer; forming a p-type layer on the active layer, so that the active layer is disposed between the n-type layer and the p-type layer; and forming a p-contact layer on the p-type layer and an n- contact layer on the transition layer or the n-type layer.

BRIEF DESCRIPTION OF THE DRAWINGS

The above and other aspects, features, and advantages of the present disclosure will become more apparent in light of the following detailed description when taken in conjunction with the accompanying drawings in which:

FIGS. 2-3 are schematic diagram of the transition layer, in accordance with two aspects of the present invention;

FIG. 4 is a schematic flow chart showing the formation of the light emitting device, in accordance with one aspect of the present invention;

DETAILED DESCRIPTION OF THE INVENTION

Preferred embodiments of the present disclosure will be described hereinbelow with reference to the accompanying drawings. In the following description, well-known functions or constructions are not described in detail to avoid obscuring the disclosure in unnecessary detail.

The terms "first," "second," and the like, herein do not denote any order, quantity, or importance, but rather are used to distinguish one element from another. The terms "a" and "an" herein do not denote a limitation of quantity, but rather denote the presence of at least one of the referenced items. The modifier "about" used in connection with a quantity is inclusive of the stated value, and has the meaning dictated by context, (e.g., includes the degree of error associated with measurement of the particular quantity).

Moreover, in this specification, the suffix "(s)" is usually intended to include both the singular and the plural of the term that it modifies, thereby including one or more of that term (e.g., "the element" may include one or more elements, unless otherwise specified). Reference throughout the specification to "one embodiment," "another embodiment," "an embodiment," and so forth, means that a particular element (e.g., feature, structure, and/or characteristic) described in connection with the embodiment is included in at least one embodiment described herein, and may or may not be present in other embodiments. Similarly, reference to "a particular configuration" means that a particular element (e.g., feature, structure, and/or characteristic) described in connection with the configuration is included in at least one configuration described herein, and may or may not be present in other configurations. In addition, it is to be understood that the described inventive features may be combined in any suitable manner in the various embodiments and configurations.

In addition, approximating language, as used herein throughout the specification and claims, may be applied to modify any quantitative representation that could permissibly vary without resulting in a change in the basic function to which it is related. Accordingly, a value modified by a term or terms, such as "about", is not limited to the precise value specified. In some instances, the approximating language may correspond to the precision of an instrument for measuring the value.

Further, as used herein, the terms "disposed on" and "adjacent" refer to layers disposed directly in contact with each other or indirectly by having intervening layers there between.

Figure 1:
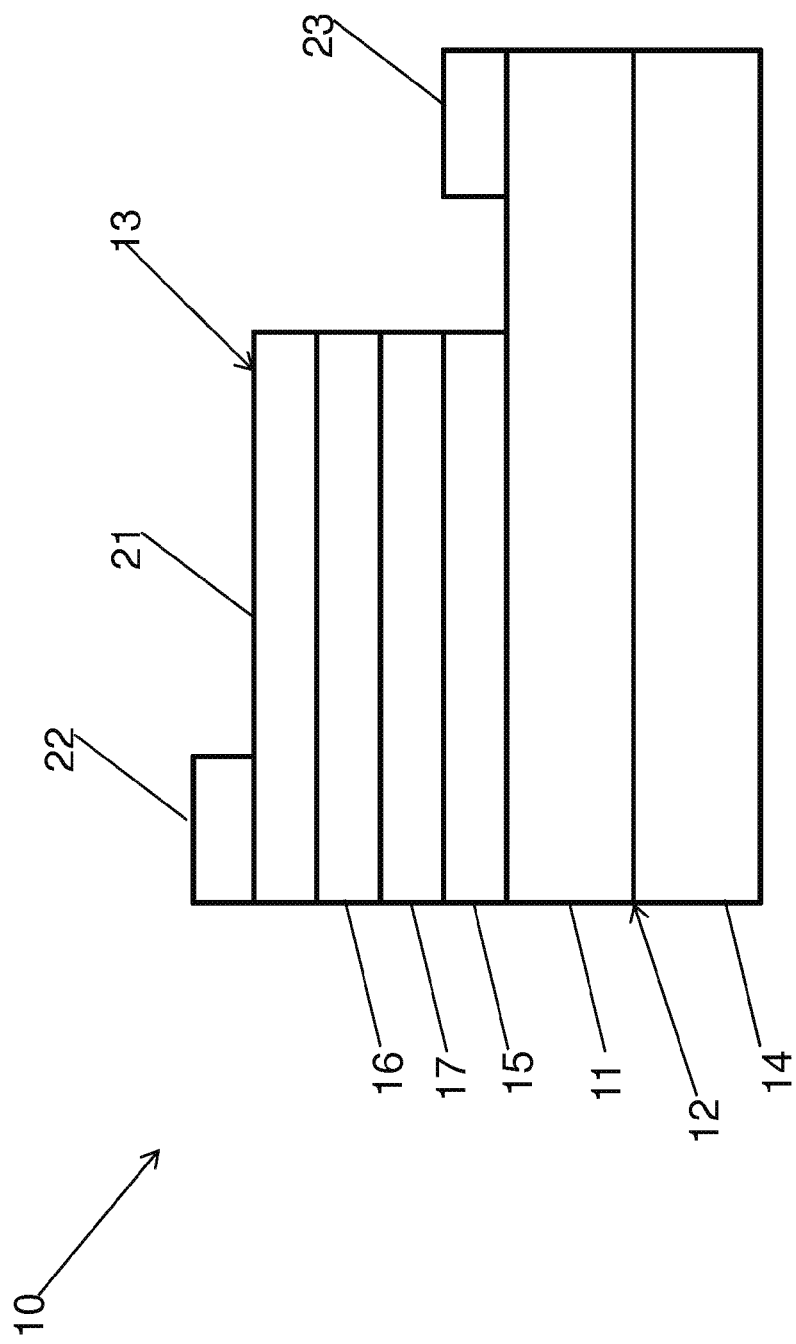
FIG. 1 is a schematic diagram of a light emitting device employing a transition layer, in accordance with one aspect of the present invention.

FIG. 1 is a schematic diagram of a light emitting device 10 employing a transition layer 11, in accordance with one aspect of the present invention. As illustrated in FIG. 1, the light emitting device 10 comprises a substrate structure 12 and a semiconductor body 13 disposed on the substrate structure 12. In one non-limiting examples, the light emitting device 10 includes a light emitting diode.

In this example, the substrate structure 12 comprises a substrate 14 and the transition layer 11. The semiconductor body 13 is disposed on the transition layer 11, and comprises a first layer 15, a second layer 16, and an active layer 17 disposed between the first and second layers 15, 16. The first layer 15 is disposed on the transition layer 11 and thus is disposed between the active layer 17 and the transition layer 11. The transition layer 11 is disposed between the first layer 15 and the substrate 14. As used herein, the term "layer" may not indicate a particular thickness of the material or composition.

In some examples, the semiconductor body 13 of the light emitting diodes comprises semiconductor material(s), and is configured to emit light during operation of the light emitting device 10. In non-limiting examples, the first layer 15 may be an n-type layer, and the second layer 16 may be a p-type layer. It will be understood by those skilled in the art that "n-type" and "p-type" refer to the majority of charge carriers, which are present in a respective layer. For example, in the n-type layer, the majority carriers are electrons, and in the p-type layer, the majority carriers are holes (the absence of electrons).

In one non-limiting example, the first layer 15 is an n-GaN (gallium nitride) layer, and the second layer 16 is a p-GaN layer. The active layer 17 includes semiconductor material in which electrically excited electrons from the first layer 15 combine with holes from the second layer 16 to generate photons having a specific wavelength for emission of light. In some embodiments, the active layer 17 of the light emitting device 10 may include a double heterojunction, or a quantum-well (QW) structure or a multiple-quantum-well (MQW) structure.

In certain applications, the active layer 17 may not be employed, so that the first layer 15 is directly connected to the second layer 16. The arrangement of the semiconductor body 13 is merely illustrative. In other applications, the semiconductor body 13 may comprise other suitable layers in addition to the first and second layers 15, 16 and the active layer 17.

The substrate 14 is configured to support formation of the transition layer 11 and the semiconductor body 13 thereon. In some applications, the substrate 14 may include, but not limited to sapphire, silicon, silicon carbide (SiC), zinc oxide (ZnO), spinel ($MgAl_2O_4$), gallium nitride (GaN), aluminum nitride (AlN), gallium phosphide (GaP), magnesium oxide (MgO), lithium aluminate ($LiAlO_2$), neodymium gallium oxide ($NdGaO_3$), $ScAlMgO_4$, $Ca_8La_2(PO_4)_6O_2$, or combination thereof. In some applications, the substrate 14 may include sapphire, silicon, or silicon carbide. In one example, the substrate 14 includes silicon.

As discussed above, in conventional processes, the direct formation of the first layer 15, such as the n-GaN may cause defects. This is disadvantageous for the performance of light emitting devices. As depicted in FIG. 1, the transition layer 11 is employed between the substrate 14 and the first layer 15 to facilitate the formation of the first layer 15 on the substrate 14.

In some examples, the transition layer 11 may comprise a plurality of sub-layers. FIGS. 2-3 are schematic diagrams of the transition layer 11, in accordance with two aspects of the present invention. As illustrated in FIG. 2, the transition layer 11 comprises a first and a second sub-layer 18, 19. In this example, the first sub-layer 18 is configured to be directly disposed on the substrate 14. The second sub-layer 19 is directly disposed on the first sub-layer 18, so as to be positioned between the first sub-layer 18 and the n-type layer 15.

In the example in FIG. 3, the transition layer 11 comprises a first, a second, and a third sub-layers 18, 19, 20. Similarly, the first sub-layer 18 is configured to be directly disposed on the substrate 14, and the second sub-layer 19 is directly disposed on the first sub-layer 18. The third sub-layer 20 is directly disposed on the second sub-layer 19.

The n-type layer 15 is disposed on the third sub-layer 20, so that the third sub-layer 20 is positioned between the n-type layer 15 and the second sub-layer 19. It should be noted the arrangements of FIGS. 2-3 are merely illustrative. In certain applications, the transition layer 11 may comprise more than three sub-layers. Each of the sub-layers may comprise one or more layers. Additionally, the same numerals in FIGS. 1-10 may indicate the similar elements.

In some embodiments, the transition layer 11 may comprise IIIA-transition metal nitride, and thus the transition layer 11 may be also referred to as a IIIA-transition metal nitride layer. As used herein, the term of "IIIA-transition metal nitride" means a composition including IIIA metal, transition metal and nitrogen. In non-limiting examples, IIIA-transition metal nitride may be formed by integrating IIIA metal into transition metal nitride or by integrating transition metal into IIIA metal nitride.

Non-limiting examples of IIIA metal include aluminum (Al), gallium (Ga), indium (In), thallium (Tl), and combination thereof. The transition metal may include IIIB-VB transition metal. Non-limiting examples of the transition metal includes titanium (Ti), zirconium (Zr), hafnium (Hf), rutherfordium (Rf), and combination thereof. IIIA metal and the transition metal may comprise any suitable metal material based on different applications. In one non-limiting examples, the IIIA metal comprises gallium and/or aluminum, and the transition metal comprises hafnium and/or zirconium.

In one non-limiting example, the first sub-layer 18 may comprise $Hf_{x''}Ga_{1-x''}N$, where x" may vary between 0 and 0.5. The second sub-layer 19 may comprise $\{Hf_xZr_yAl_zGa_{1-x-y-z}N/Hf_xZr_{y'}Al_{z'}Ga_{1-x'-y'-z'}N\}_n$, where each of x, x', y, y', z, and z' may vary between 0 and 1, x+y+z=1, x'+y'+z'=1, and n is an integral number and may vary between 1 and 60. In some applications, the second sub-layer 19 may comprise n sub-layers each layer comprising one or more layers of $Hf_xZr_yAl_zGa_{1-x-y-z}N$ and the $Hf_xZr_{y'}Al_{z'}Ga_{1-x'-y'-z'}N$ based on different applications. Accordingly, in one example, the transition layer 11 may have a structure of $\{Hf_xZr_yAl_zGa_{1-x-y-z}N/Hf_xZr_{y'}Al_{z'}Ga_{1-x'-y'-z'}N\}_n/Hf_{x''}Ga_{1-x''}N$.

In other examples, the first sub-layer 18 may comprise the material of $Hf_{x''}Zr_{y''}Al_{z''}Ga_{1-x''-y''-z''}N$, where x", y" and z" may vary between 0 and 1, and x"+y"+z"=1.

In some embodiments, the transition layer 11 may further comprise the third sub-layer 20, which may comprise $Hf_{x'''}Zr_{y'''}Al_{z'''}Ga_{1-x'''-y'''-z'''}N$, where x''', y''', and z''' may vary between 0 and 1, x'''+y'''+z'''=1. Thus, the transition layer 11 may have a structure of $Hf_{x'''}Zr_{y'''}Al_{z'''}Ga_{1-x'''-y'''-z'''}N/\{Hf_xZr_yAl_zGa_{1-x-y-z}N/Hf_xZr_{y'}Al_{z'}Ga_{1-x'-y'-z'}N\}_n/Hf_{x''}Ga_{1-x''}N$, where x" may vary between 0 and 0.5, and n may vary between 0 and 60.

In some applications, compositions of the sub-layers 18, 19, and/or 20 may be different from each other. In certain applications, the material/compositions of the sub-layers 18, 19, and/or 20 may be exchanged. For example, the sub-layer 18 may comprise $\{Hf_xZr_yAl_zGa_{1-x-y-z}N/Hf_xZr_{y'}Al_{z'}Ga_{1-x'-y'-z'}N\}_n$. The second sub-layer 19 may comprise $Hf_{x''}Ga_{1-x''}N$. In certain applications, the transition layer 11 may not comprise the third sub-layer 20. As use herein, the letters of x, x', x", x''', y, y', y", y'''z', z" and z''' means the contents of compositions Hf, Ga, N, Al, Zr, and may be substituted by other letters or exchanged among them. For example, although as described above, the first sub-layer 18 may comprise the material of $Hf_{x''}Zr_{y''}Al_{z''}Ga_{1-x''-y''-z''}N$, where x", y" and z" may vary between 0 and 1, and x"+y"+z"=1. In certain applications, the first sub-layer 18 may be defined to comprise the material of $Hf_xZr_yAl_{z'}Ga_{1-x'-y'-z'}N$, where x', y' and z' may vary between 0 and 1, and x'+y'±z'=1.

In one non-limiting example, the transition layer 11 comprises $Hf_{1-x}Ga_xN$, where x is greater than 0.97, 0.9, or is equal to 0.995. In other examples, the transition layer 11 may comprise $Hf_{1-x}Al_xN$, where x is smaller than 0.01, 0.17, or is equal to 0.05. In certain applications, each sub-layer of the transition layer 11 may comprise grading compositions, which means contents of one or more compositions of each sub-layer may be varied gradually. For example, when the transition layer 11 comprises the $Hf_{1-x}Ga_xN$ sub-layer, x may vary from 0 to 0.03, or from 0.03 to 0. When the transition layer 11 comprises the $Hf_{1-x}Al_xN$ layer, x may vary from 0 to 0.17, or from 0.17 to 0.

Accordingly, due to the formation of the transition layer 11 on the substrate 14, the substrate structure 12 is formed as a single-crystal substrate having high quality, so that the semiconductor body 13 grows on the substrate structure 12 to form the thin-film micro-cavity light emitting device 10.

Compared to traditional transition nitride and IIIA nitride, the IIIA-transition metal nitride has better properties. For example, $Hf_{x''}Al_{1-x''}N$ or $Hf_{x''}Ga_{1-x''}N$ may have better crystallinity and electrical conductivity properties than $Hf_xN$, AlN, and GaN. In one example, due to the formation of IIIA-transition metal nitride, a HfN/GaHfN structure has better conductivity than a HfN/GaN structure. The IIIA-transition metal nitride, such as HfAlN and HfGaN benefits the performance of the light emitting device 10.

As used herein, the HfN/HfGaN structure means the structure comprises two layers including a HfN layer and a HfGaN layer. Similarly, $\{Hf_xZr_yAl_zGa_{1-x-y-z}N/Hf_xZr_{y'}Al_{z'}Ga_{1-x'-y'-z'}N\}_n$ structure may have n layers of a $\{Hf_xZr_yAl_zGa_{1-x-y-z}N/Hf_xZr_{y'}Al_{z'}Ga_{1-x'-y'-z'}N\}$ structure with each $\{Hf_xZr_yAl_zGa_{1-x-y-z}N/Hf_xZr_{y'}Al_{z'}Ga_{1-x'-y'-z'}N\}$ structure comprising one or two of a layer of $Hf_xZr_yAl_zGa_{1-x-y-z}N$ and a layer of $Hf_xZr_{y'}Al_{z'}Ga_{1-x'-y'-z'}N$ based on different applications. For example, when n is equal to 1, the $\{Hf_xZr_yAl_zGa_{1-x-y-z}N/Hf_xZr_{y'}Al_{z'}Ga_{1-x'-y'-z'}N\}_n$ structure comprises the one of the layer of $Hf_xZr_yAl_zGa_{1-x-y-z}N$ and the layer of $Hf_xZr_{y'}Al_{z'}Ga_{1-x'-y'-z'}N$. When n is equal to 2, the $\{Hf_xZr_yAl_zGa_{1-x-y-z}N/Hf_xZr_{y'}Al_{z'}Ga_{1-x'-y'-z'}N\}_n$ tructure comprises two layers of the $\{Hf_xZr_yAl_zGa_{1-x-y-z}N/Hf_xZr_{y'}Al_{z'}Ga_{1-x'-y'-z'}N\}$ structure with each layer comprising the structure of $\{Hf_xZr_yAl_zGa_{1-x-y-z}N/Hf_xZr_{y'}Al_{z'}Ga_{1-x'-y'-z'}N\}$. Similarly, each of the layer of $Hf_xZr_yAl_zGa_{1-x-y-z}N$ and the layer of $Hf_xZr_{y'}Al_{z'}Ga_{1-x'-y'-z'}N$ may comprise grading compositions.

In the illustrated example in FIG. 1, the light emitting device 10 further comprises a p contact layer 21 disposed on the second layer 16 to be in ohmic contact with the second layer 16. In one non-limiting example, the p contact layer 21 comprises indium tin oxide (ITO). In certain applications, the p contact layer 21 may comprise IIIA-transition metal nitride, which is similar to the transition layer 11.

In addition, the light emitting device 10 comprises a first and a second electrically conductive elements 22, 23. The first electrically conductive element 22 is conductively coupled to the p contact layer 21, and the second electrically conductive element 23 is conductively coupled to the transition layer 11, which may be referred to as a p-element and an n-element, respectively. In some embodiments, the first and second electrically conductive elements 22, 23 are configured to act as electrode terminals to electrically connect to a power source (not shown).

Thus, during operation of the light emitting device 10, the first layer 15 and the second layer 16 are electrically excited to generate electrons and holes for light generation. In some applications, the first electrically conductive element 22 comprises metal including, but not limited to nickel (Ni), gold (Au), ITO, and combination thereof. The second electrically conductive element 23 comprises metal including, but not limited to titanium (Ti), aluminum (Al), nickel (Ni) and gold (Au), combination thereof. The arrangement of the first electrically conductive element 22 is merely illustrative. In one example, when the first electrically conductive element 22 includes ITO, the first electrically conductive element 22 may be optionally formed on the entire upper surface (not labeled) of the p contact layer 21.

Accordingly, during the formation of the light emitting device 10, as illustrated in FIG. 4, in step 24, the substrate 14 is provided. In step 25, the transition layer 11 is formed on the substrate 14 to form IIIA-transition metal layer on the substrate 14. Different techniques may be used to grow the transition layer 11 on the substrate 14. Non-limiting examples of the techniques include molecular-beam epitaxy (MBE), metal-organic chemical vapor deposition (MOCVD), chemical vapor deposition (CVD), physical vapor deposition (PVD), and reactive sputtering.

In step 26, the semiconductor body 13 is formed on the transition layer 11. During formation of the semiconductor body 13, the first layer 15, the active layer 17, and/or the second layer 16 may be formed on the transition layer 11 in turn. Similar to the formation of the transition layer 11 on the substrate 14, different techniques may be employed.

Figure 5:
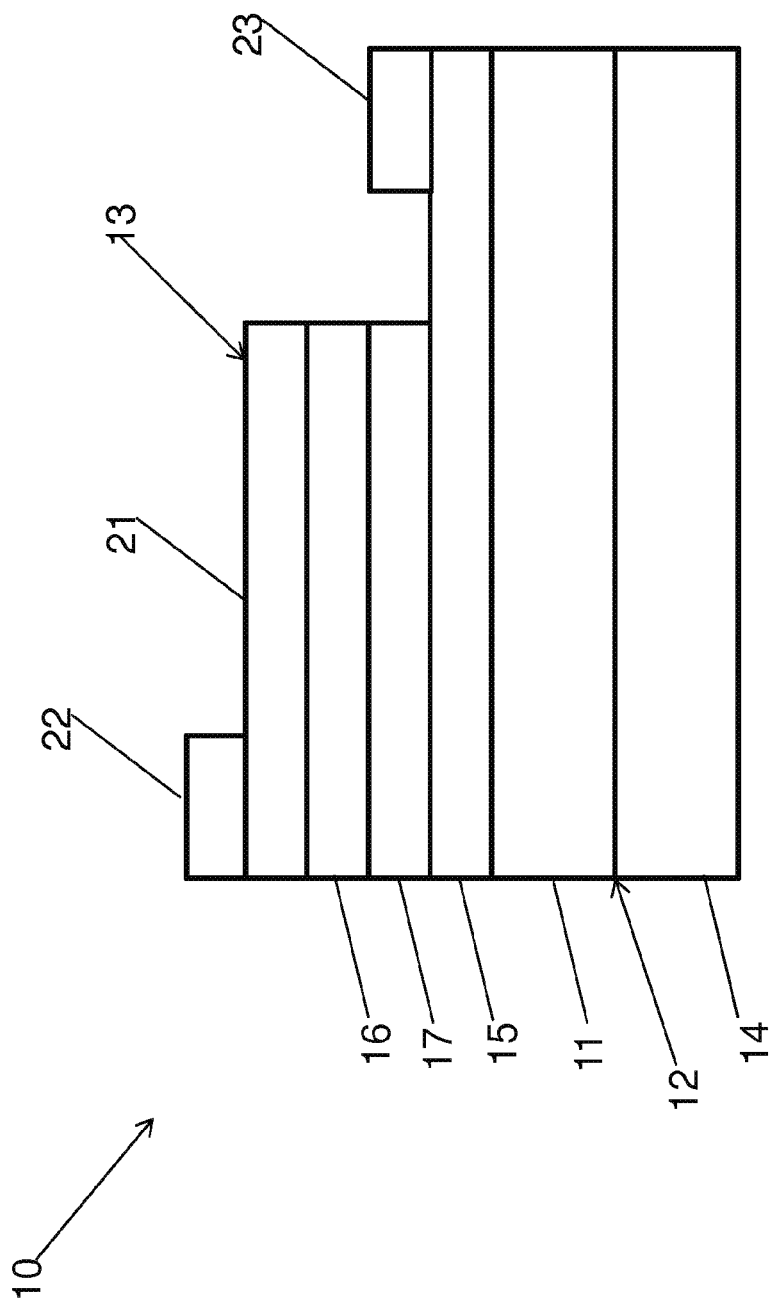
FIG. 5 is a schematic diagram of the light emitting device employing the transition layer, in accordance with another aspect of the present invention.

In step 27, the p contact layer 21 is formed to be electrically coupled to the second layer 16. In step 28, the first and second electrically conductive elements 22, 23 are disposed to be electrically coupled to the p contact layer 21 and the transition layer 11. In this illustrated example, the second electrically conductive element 23 is coupled to an upper surface (not labeled) of the transition layer 11, which is adjacent to the semiconductor body 13. Alternatively, as depicted in FIG. 5, the second electrically conductive element (or the n-element) 23 is electrically coupled to the first (or the n-type) layer 15 to cooperate with the first electrically conductive element 22 to excite the active layer 17 for light generation.

In some embodiments, due to similar properties, such as lattice constant, crystalline structure with III-V metal nitride and the transition metal nitride of the transition (or the IIIA-transition metal nitride) layer 11, the transition layer 11 may be readily integrated with the III-V metal nitride and the transition metal nitride. Similarly, non-limiting examples of III-V metal include aluminum (Al), gallium (Ga), indium (In), thallium (Tl), and combination thereof. Non-limiting examples of the transition metal includes titanium (Ti), zirconium (Zr), hafnium (Hf), rutherfordium (Rf), and combination thereof.

Figure 6:
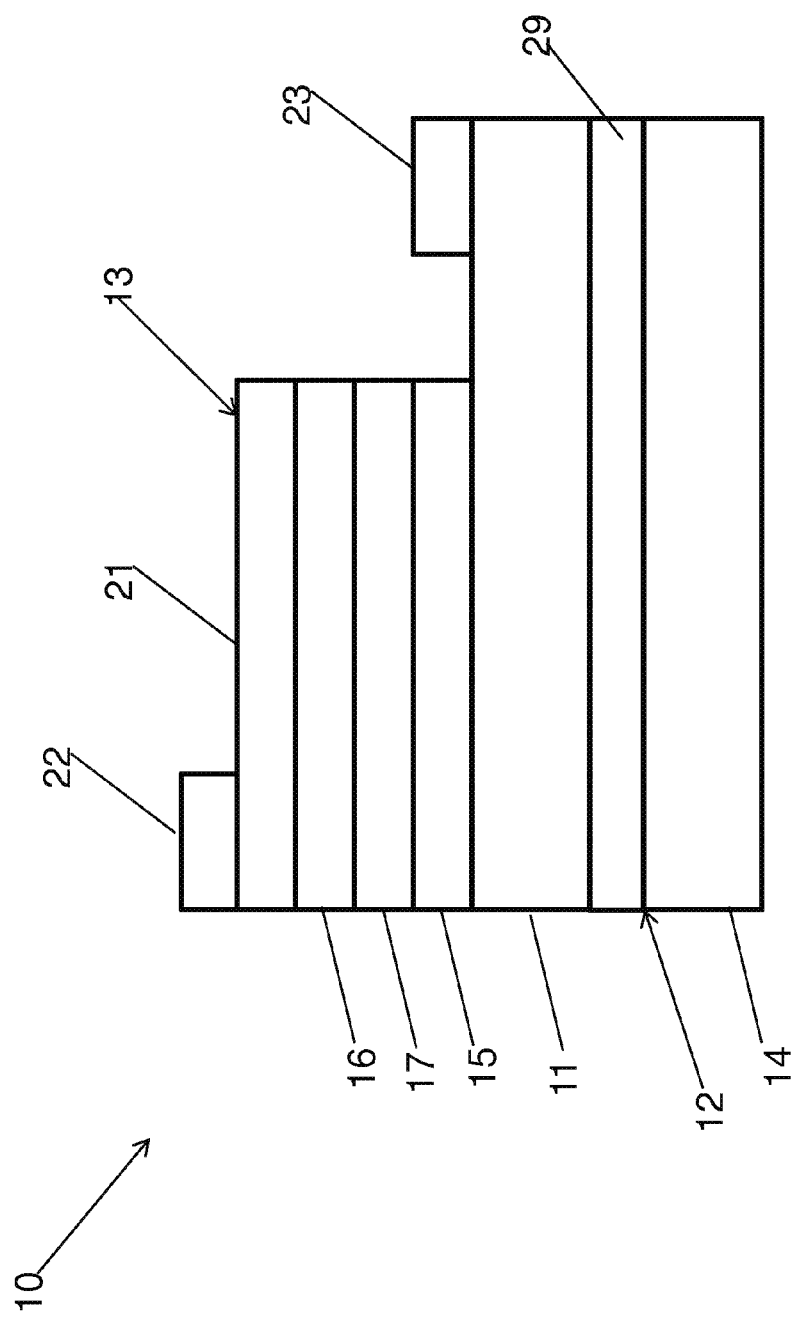
FIG. 6 is a schematic diagram of the light emitting device shown in FIG. 1 and employing a buffer layer, in accordance with one aspect of the present invention.

FIG. 6 is a schematic diagram of the light emitting device 10 shown in FIG. 1 and employing a buffer layer 29, in accordance with one aspect of the present invention. The buffer layer 29 of the substrate structure 12 comprises III-V nitride, so that the transition layer 11 is integrated or sandwiched between the buffer layer 29 and the n-type layer 15, which is n-GaN in the example.

Figure 7:
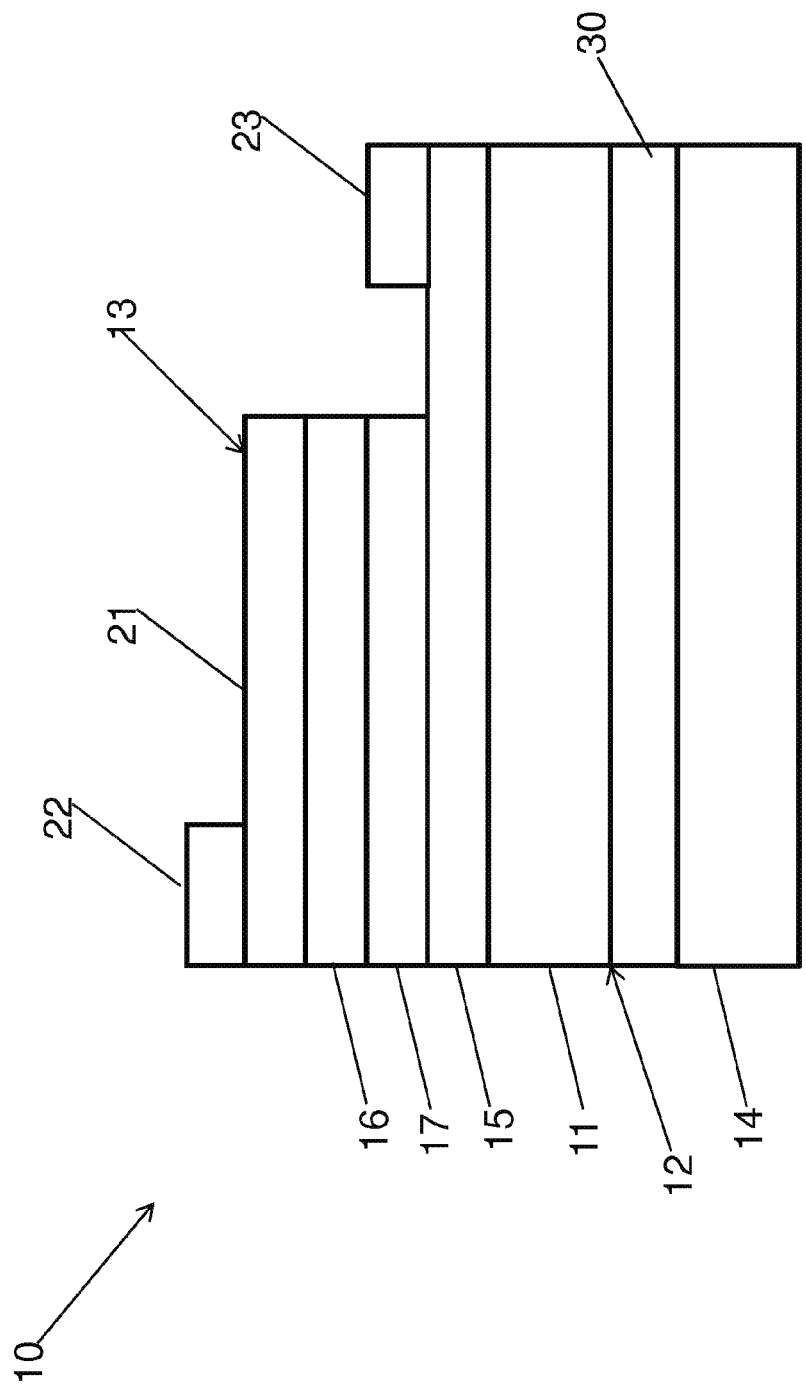
FIG. 7 is a schematic diagram of the light emitting device shown in FIG. 5 and employing the buffer layer, in accordance with one aspect of the present invention.

Thus, because of the existence of the transition (or the IIIA-transition metal nitride) layer 11, the buffer (or III-V nitride) layer 29 may be relatively readily to be formed on the transition layer 11 and to be coupled to the substrate 14. The arrangement in FIG. 6 is similar as the arrangement in FIG. 1. The two arrangements in FIGS. 1 and 6 differ in that in FIG. 6, the buffer layer 29 is disposed between the transition layer 11 and the substrate 14. Alternatively, a buffer layer 30 similar to the buffer layer 29 in FIG. 6 may also be employed in the arrangement in FIG. 5, as illustrated in FIG. 7

Figure 8:
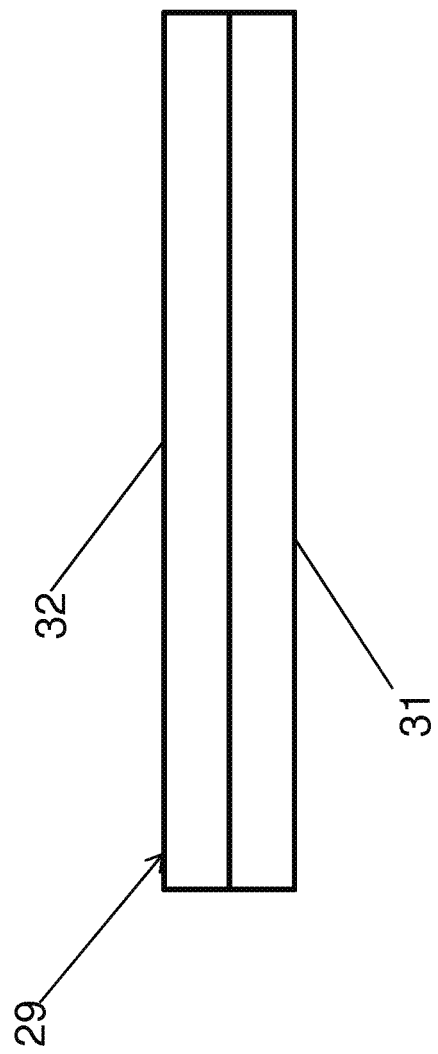
FIG. 8 is a schematic diagram of the buffer layer, in accordance with one aspect of the present invention.

In the illustrated example, the buffer layer 29 comprises one or more sub-layers, such as a first and a second sub-layers 31, 32, as illustrated in FIG. 8. In the illustrated example of FIG. 8, the first buffer sub-layer 31 is configured to be coupled to the substrate 14 and may comprise the material/composition of $\{Al_xGa_yIn_{1-x-y}N/Al_xGa_{y'}In_{1-x'-y'}N\}_n$, where x, x', y and y' may vary between 0 and 1, x+y=1, x'±y'=1, and n may vary between 0 and 60. As used herein, $Al_xGa_yIn_{1-x-y}N/Al_xGa_yIn_{1-x'-y'}N\}_n$ means the sub-layer 31 may comprise one or more layers of a layer of $Al_xGa_yIn_{1-x-y}N$ and a layer of $Al_xGa_yIn_{1-x'-y'}N$. The second buffer sub-layer 32 is configured to be coupled to the first buffer sub-layer 31 and may comprise the composition of $Al_{x''}Ga_{y''}In_{1-x''-y''}N$, where x'' and y'' may vary between 0 and 1, x''+y''=1.

Accordingly, the buffer layer 29 may have a structure of $Al_{x''}Ga_{y''}In_{1-x''-y''}N/\{Al_xGa_yIn_{1-x-y}N/Al_xGa_yIn_{1-x'-y'}N\}_n$.

In some examples, the compositions of the sub-layers 31 and/or 32 may be different from each other. In certain applications, the material of the sub-layers 31, 32 may be exchanged. For example, the sub-layer 31 may comprise $Al_{x''}Ga_{y''}In_{1-x''-y''}N$, and the sub-layer 32 may comprise $\{Al_xGa_yIn_{1-x-y}N/Al_xGa_yIn_{1-x'-y'}N\}_n$. In certain applications, the buffer layer 29 may not be employed. In non-limiting examples, the buffer layer 29 may comprise aluminum nitride (AlN), gallium nitride (GaN) or $Al_xGa_{1-x}N$, where x may vary between 0 and 1.

Figure 9:
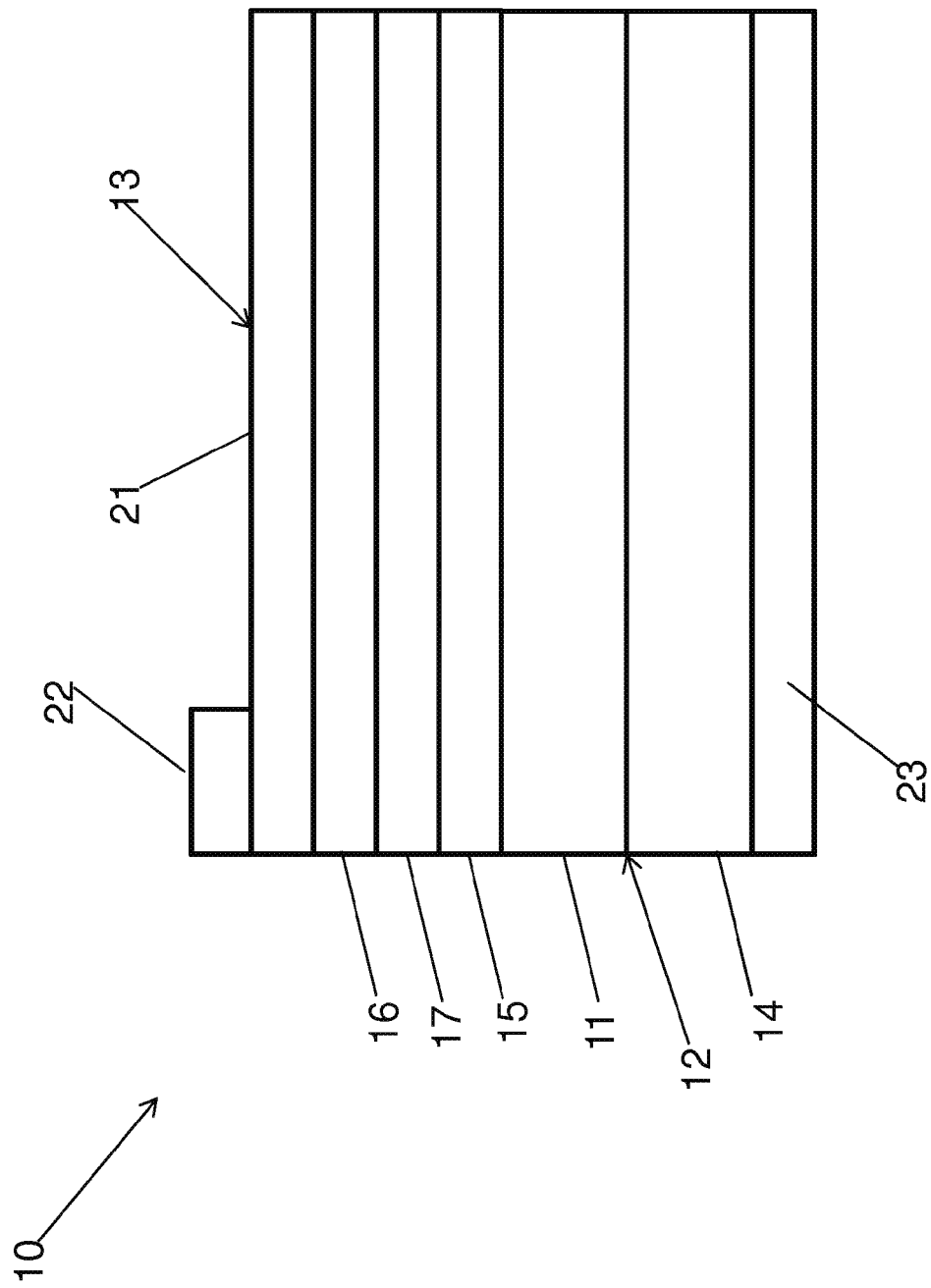
FIGS. 9-10 are schematic diagram of the light emitting device, in accordance with other aspects of the present invention.
Figure 10:
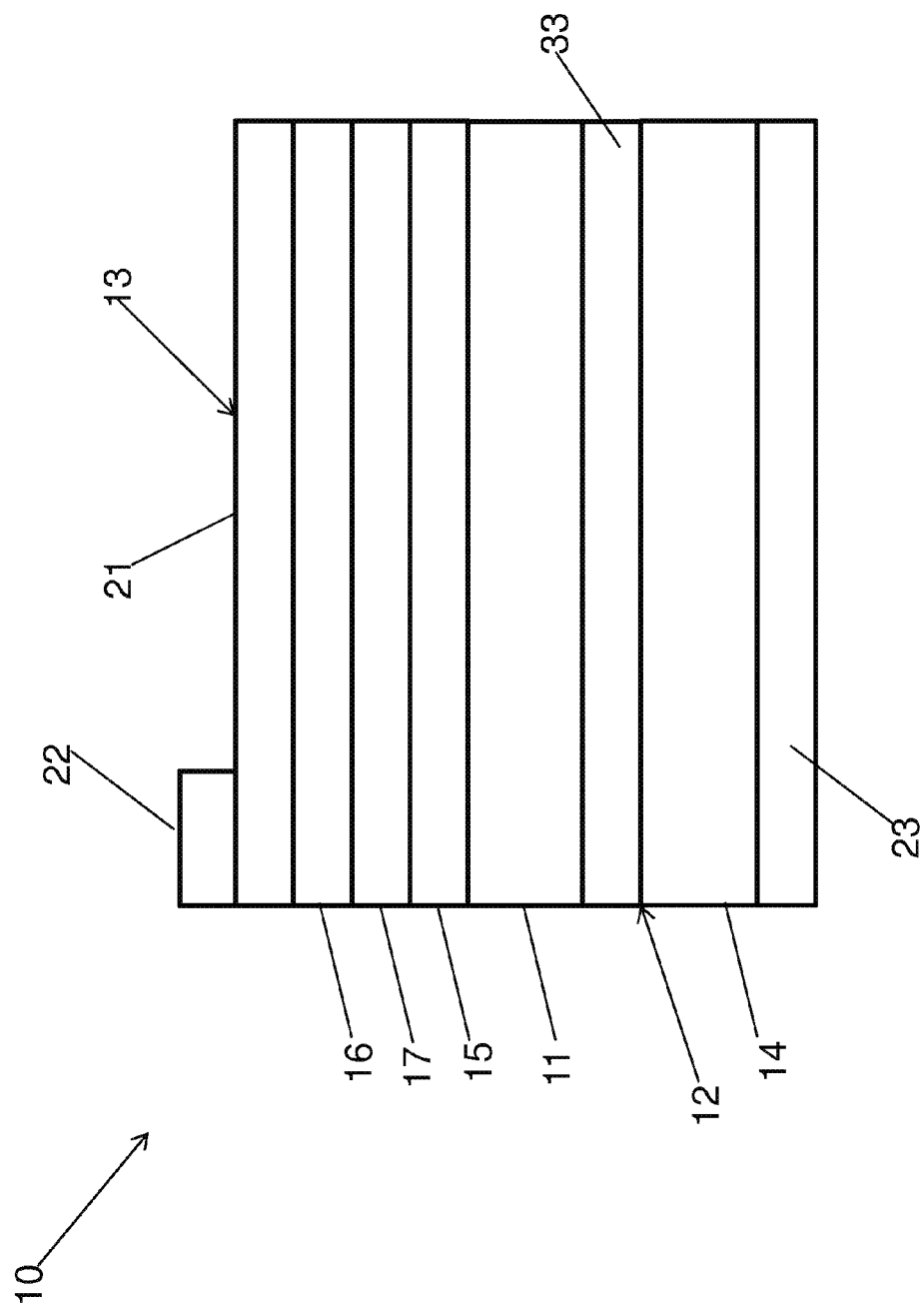

FIGS. 9-10 are schematic diagram of the light emitting device 10, in accordance with other aspects of the present invention. As illustrated in FIG. 9, the arrangement thereof is similar to the arrangement in FIG. 1. The two arrangements in FIGS. 1 and 9 differ in that in FIG. 9, the second electrically conductive element 23 is coupled to a bottom surface (not labeled) of the substrate 14. Additionally, the arrangement in FIG. 10 is similar to the arrangement in FIG. 9. The two arrangements in FIGS. 1 and 10 differ in that in FIG. 10, a buffer layer 33 is disposed between the transition layer 11 and the substrate 14. The buffer layer 32 may have the similar structure and material as the buffer layer 29 in FIG. 6. In one non-limiting example, in the arrangements of FIGS. 9-10, the substrate 14 includes silicon.

In embodiments of the invention, the light emitting device 10 employs the transition layer 11 disposed between the semiconductor layer 13 and the substrate 14. In certain applications, the transition layer 11 may be also regarded as a buffer layer. Due to the formation of the transition layer 11 on the substrate 14, the substrate structure 12 has a single-crystal structure having high quality, and the semiconductor body 13 thus grows on the substrate structure 12 to form the thin-film micro-cavity light emitting device 10.

In addition, the transition (or the IIIA-transition metal nitride) layer 11 comprises similar properties, such as lattice constant, crystalline structure with III-V metal nitride and the transition metal nitride of the transition layer 11, the transition layer 11 may be readily integrated with the III-V metal and the transition metal nitride. For example, based on different contents of IIIA metal thereof, a layer of IIIA-transition metal nitride, such as $Hf(Zr)_xGa(Al)_{1-x}N$, may be integrated with the III-V metal and the transition metal nitride when x is smaller than 0.5 and is greater than 0.5, respectively.

Compared to conventional processes of direct formation of the n-GaN layer 15 of the semiconductor body 13 on the substrate 14, the issue of cracking of the n-GaN may be avoided or eliminated, and the light emitting device 10 is formed having high quality.

While the disclosure has been illustrated and described in typical embodiments, it is not intended to be limited to the details shown, since various modifications and substitutions can be made without departing in any way from the spirit of the present disclosure. As such, further modifications and equivalents of the disclosure herein disclosed may occur to persons skilled in the art using no more than routine experimentation, and all such modifications and equivalents are believed to be within the spirit and scope of the disclosure as defined by the following claims.

What is claimed is:

1. A light emitting device, comprising:
   a substrate;
   a semiconductor body configured to generate light and comprising an n-type layer disposed on the substrate, a p-type layer disposed on the n-type layer and an active layer disposed between the n-type layer and the p-type layer;
   a transition layer disposed on the substrate and located between the n-type layer and the substrate, the transition layer comprising a plurality of sub-layers, the plurality of the sub-layers comprising compositions different from each other, and each sub-layer comprising the composition including IIIA metal, transition metal, and nitrogen; and
   a p-contact layer disposed on the p-type layer of the semiconductor body;
   a buffer layer, the buffer layer comprising a plurality of sub-layers, each sublayer of the buffer layer comprising a composition including IIIA metal and nitrogen, the plurality of sub-layers of the buffer layer and the plurality of sub-layers of the transition layer are arranged as alternating layers of at least one sub-layer of the buffer layer and at least one sub-layer of the transition layer.

2. The light emitting device of claim 1, wherein the IIIA metal comprises aluminum (Al), gallium (Ga), indium (In), thallium (Tl), and combination thereof, and wherein the transition metal comprises titanium (Ti), zirconium (Zr), hafnium (Hf), rutherfordium (Ri), and combination thereof.

3. The light emitting device of claim 2, wherein the IIIA metal comprises one or two of aluminum and gallium, and wherein the transition metal comprises one or two of hafnium and zirconium.

4. The light emitting device of claim 1, wherein the transition layer comprises a first sub-layer comprising material of $Hf_{x''}Zr_{y''}Al_{z''}Ga_{1-x''-y''-z''}N$, wherein a second sub-layer comprising material of $\{Hf_xZr_yAl_zGa_{1-x-y-z}N/Hf_xZr_{y'}Al_{z'}Ga_{1-x'-y'-z'}\}_n$, where each of x, x', x'', y, y', y'', z, z', and z'' varies between 0 and 1, x+y+z=1, x'+y'+z'=1, x''+y''+z''=1, and n is an integral number and varies between 1 and 60.

5. The light emitting device of claim 4, wherein the transition layer comprises $Hf_{1-x}Ga_xN$ or $Hf_{1-x}Al_xN$, when the transition layer comprises $Hf_{1-x}Ga_xN$, x is greater than 0.97, 0.9, or is equal to 0.995, and wherein when the transition layer comprises $Hf_{1-x}Al_xN$, x is smaller than 0.01, 0.17, or is equal to 0.05.

6. The light emitting device of claim 4, wherein the transition layer further comprises a third sub-layer comprising $Hf_{x'''}Zr_{y'''}Al_{z'''}Ga_{1-x'''-y'''-z'''}N$, where x''', y''', and z''' vary between 0 and 1, x'''+y'''+z'''=1.

7. The light emitting device of claim 1, further comprising another buffer layer disposed between the transition layer and the substrate,
   wherein the another buffer layer comprises a plurality of buffer sub-layers, wherein a first buffer sub-layer of the another buffer layer comprises $\{Al_xGa_yIn_{1-x-y}N/Al_xGa_yIn_{1-x'-y'}N\}n$, and
   wherein a second buffer sub-layer of the another buffer layer comprises $Al_{x''}Ga_{y''}In_{1-x''-y''}N$, where x, x', x'', y, y', and y'' vary between 0 and 1, x+y=1, x'+y'=1, x''+y''=1, and n is an integral number and varies between 0 and 60.

8. The light emitting device of claim 7, wherein the another buffer layer comprises aluminum nitride (AlN), gallium nitride (GaN) or $Al_xGa_{1-x}N$, where x varies between 0 and 1.

9. The light emitting device of claim 1, wherein each sub-layer of the transition layer comprises grading compositions.

10. The light emitting device of claim 1, further comprising a first electrically conductive element electrically connected to the p-contact layer, and a second electrically conductive element electrically connected to the transition layer or the n-type layer.

11. The light emitting device of claim 1, wherein the n-type layer comprises n-GaN, the p-type layer comprises p-GaN layer, and the substrate comprises sapphire, silicon, or silicon carbide (SiC).

12. The light emitting device of claim 1, wherein at least one sublayer has two or more transition metals.

13. The light emitting device of claim 1, wherein each sublayer has at least a common transitional metal.

14. The light emitting device of claim 13, wherein the common transitional metal is Hf or Zr.

15. The light emitting device of claim 1, further comprising:
    the plurality of sub-layers of the buffer layer having different compositions from each other.

16. The light emitting device of claim 1, further comprising:
    at least one sub-layer of the buffer layer is disposed between the sub-layers of the transition layer.

17. The light emitting device of claim 1, further comprising:
    a second transition layer, the second transition layer comprising a plurality of sub-layers, the plurality of the sub-layers of the second transition layer comprising a composition including transition metal and nitrogen.

18. A substrate structure, comprising:
    a substrate;
    a transition layer disposed on the substrate and located between an n-type layer and the substrate, the transition layer comprising a plurality of sub-layers, the plurality of the sub-layers comprising compositions different from each other, and each sub-layer comprising the composition including IIIA metal, transition metal, and nitrogen; and
    a buffer layer, the buffer layer comprising a plurality of sub-layers, each sublayer of the buffer layer comprising a composition including IIIA metal and nitrogen, the plurality of sub-layers of the buffer layer and the plurality of sub-layers of the transition layer are arranged as alternating layers of at least one sub-layer of the buffer layer and at least one sub-layer of the transition layer.

19. The substrate structure of claim 18, wherein the IIIA metal comprises one or two of aluminum and gallium, and the transition metal comprises hafnium.

20. The substrate structure of claim 19, wherein the transition layer comprises a first sub-layer comprising material of $Hf_{x''}Zr_{y''}Al_{z''}Ga_{1-x''-y''-z''}N$, wherein a second sub-layer comprising material of $\{Hf_xZr_yAl_zGa_{1-x-y-z}N/Hf_xZr_{y'}Al_{z'}Ga_{1-x'-y'-z'}N\}_n$, wherein each of x, x', x'', y, y', y'', z, z', and z'' vary between 0 and 1, x+y+z=1, x'+y'+z'=1, x''+y''+z''=1, and n is an integral number and may vary between 1 and 60.

21. The substrate structure of claim 20, wherein the transition layer comprises $Hf_{1-x}Ga_xN$ or $Hf_{1-x}Al_xN$, when the transition layer comprises $Hf_{1-x}Ga_xN$, x is greater than 0.97, 0.9, or is equal to 0.995; the transition layer comprises $Hf_{1-x}Al_xN$, x is smaller than 0.01, 0.17, or is equal to 0.05.

22. The substrate structure of claim 20, wherein the transition layer further comprises a third sub-layer comprising $Hf_{x'''}Zr_{y'''}Al_{z'''}Ga_{1-x'''-y'''-z'''}N$, where x''', y''', and z''' vary between 0 and 1, x'''+y'''+z'''=1.

23. The substrate structure of claim 18, further comprising another buffer layer disposed between the transition layer and the substrate,
    wherein the another buffer layer comprises a plurality of buffer sub-layers, and
    wherein a first buffer sub-layer of the another buffer layer comprises $\{Al_xGa_yIn_{1-x-y}N/Al_{x'}Ga_{y'}In_{1-x'-y'}N\}_n$, and a second buffer sub-layer of the another buffer layer comprises $Al_{x''}Ga_{y''}In_{1-x''-y''}N$, where x, x', x'', y, y', and y'' vary between 0 and 1, x+y=1, x'+y'=1, x''+y''=1, and n is an integral number and varies between 0 and 60.

24. The substrate structure of claim 23, wherein the another buffer layer comprises aluminum nitride (AlN), gallium nitride (GaN) or $Al_xGa_{1-x}N$, where x varies between 0 and 1.

25. The substrate structure of claim 18, wherein each sub-layer of the transition layer comprises grading compositions.

26. A method for making a light emitting device, comprising:
    forming a transition layer on a substrate, wherein the transition layer comprises a plurality of sub-layers, the plurality of the sub-layers comprise compositions different from each other, and each sub-layer comprises the composition including IIIA metal, transition metal, and nitrogen;
    forming an n-type layer on the transition layer;
    forming an active layer on the n-type layer;
    forming a p-type layer on the active layer, so that the active layer is disposed between the n-type layer and the p-type layer;
    forming a p-contact layer on the p-type layer and an n-contact layer on the transition layer or the n-type layer; and
    forming a buffer layer, the buffer layer comprising a plurality of sub-layers, each sublayer of the buffer layer comprising a composition including IIIA metal and nitrogen, the plurality of sub-layers of the buffer layer and the plurality of sub-layers of the transition layer are arranged as alternating layers of at least one sub-layer of the buffer layer and at least one sub-layer of the transition layer.

27. The method of claim 26, further comprising disposing a first electrically conductive element on the p-contact layer, and a second electrically conductive element on the transition layer or the n-type layer.

28. The method of claim 26, wherein the IIIA metal comprises one or two of aluminum and gallium, and wherein the transition metal comprises one or two of hafnium and zirconium.

29. The method of claim 26, wherein the transition layer comprises a first sub-layer comprising material of $Hf_{x''}Zr_{y''}Al_{z''}Ga_{1-x''-y''-z''}N$, wherein a second sublayer comprising material of $\{Hf_xZr_yAl_zGa_{1-x-y-z}N/hf_{x'}Zr_{y'}Al_{z'}Ga_{1-x'-y'-z'}N\}_n$, where each of x, x', x'', y, y', y'', z, z', and z'' may vary between 0 and 1, x+y+z=1, x'+y'+z'=1, and n is an integral number and may vary between 1 and 60.

30. The method of claim 29, wherein the transition layer further comprises a third sub-layer comprising $Hf_{x'''}Zr_{y'''}Al_{z'''}Ga_{1-x'''-y'''-z'''}$, where x''', y''', and z''' may vary between 0 and 1, x'''+y'''+z'''=1.

31. The method claim 26, further comprising another buffer layer disposed between the transition layer and the substrate, wherein the another buffer layer comprises a plurality of buffer sub-layers, wherein a first buffer sub-layer of the another buffer layer comprises $\{Al_xGa_yIn_{1-x-y}N/Al_{x'}Ga_{y'}In_{1-x'-y'}N\}n$, and a second buffer sub-layer of the another buffer layer comprises $Al_{x''}Ga_{y''}In_{1-x''-y''}N$, where x, x', x'', y, y', and y''' may vary between 0 and 1, x+y=1, x'+y'=1, x''+y''=1, and n is an integral number and may vary between 0 and 60.

32. The method claim 26, wherein the another buffer layer comprises aluminum nitride (AlN), gallium nitride (GaN) or $Al_xGa_{1-x}N$, where x may vary between 0 and 1.

33. The method claim 26, wherein each sub-layer of the transition layer comprises grading compositions.

* * * * *